(12) United States Patent
Matocha et al.

(10) Patent No.: US 8,377,812 B2
(45) Date of Patent: Feb. 19, 2013

(54) SIC MOSFETS AND SELF-ALIGNED FABRICATION METHODS THEREOF

(75) Inventors: Kevin Sean Matocha, Rexford, NY (US); Gregory Keith Dudoff, Clifton Park, NY (US); William Gregg Hawkins, Rexford, NY (US); Zachary Matthew Stum, Niskayuna, NY (US); Stephen Daley Arthur, Glenville, NY (US); Dale Marius Brown, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 511 days.

(21) Appl. No.: 12/483,469

(22) Filed: Jun. 12, 2009

(65) Prior Publication Data
US 2009/0242901 A1 Oct. 1, 2009

Related U.S. Application Data

(63) Continuation-in-part of application No. 11/593,317, filed on Nov. 6, 2006, now abandoned.

(51) Int. Cl.
*H01L 21/28* (2006.01)
(52) U.S. Cl. ........ 438/586; 438/655; 438/664; 438/683; 438/931; 257/E21.063; 257/E21.165; 257/E21.182
(58) Field of Classification Search .................. 257/335, 257/342, 412, 413, E21.062, E21.063, E21.165, 257/E21.168, E21.182, E29.158, E29.161, 257/E29.256, E29.262; 438/268, 586, 655–657, 438/664, 931, 683, 685
See application file for complete search history.

(56) References Cited

U.S. PATENT DOCUMENTS

| | | | | |
|---|---|---|---|---|
| 4,472,237 A | * | 9/1984 | Deslauriers et al. | 438/664 |
| 5,124,779 A | * | 6/1992 | Furukawa et al. | 257/77 |
| 5,442,200 A | | 8/1995 | Tischler | |
| 5,514,604 A | | 5/1996 | Brown | |
| 5,597,744 A | * | 1/1997 | Kamiyama et al. | 438/285 |
| 5,963,791 A | | 10/1999 | Brown et al. | |
| 6,013,569 A | * | 1/2000 | Lur et al. | 438/595 |
| 6,238,980 B1 | * | 5/2001 | Ueno | 438/268 |

(Continued)

OTHER PUBLICATIONS

Normally Off Type SiC Power MOSFET (IEMOS) With World Record On-Resistance, The Power Electronics Research Center (PERC) of the National Institute of Advanced Industrial Science and Technology (AIST) downloaded from http://www.azom.com/News.asp?NewsID=2720 on Mar. 20, 2009.

(Continued)

*Primary Examiner* — Zandra Smith
*Assistant Examiner* — Toniae Thomas
(74) *Attorney, Agent, or Firm* — Penny A. Clark

(57) ABSTRACT

The present invention provides a method of fabricating a metal oxide semiconductor field effect transistor. The method includes the steps of forming a source region on a silicon carbide layer and annealing the source region. A gate oxide layer is formed on the source region and the silicon carbide layer. The method further includes providing a gate electrode on the gate oxide layer and disposing a dielectric layer on the gate electrode and the gate oxide layer. The method further includes etching a portion of the dielectric layer and a portion of the gate oxide layer to form sidewalls on the gate electrode. A metal layer is disposed on the gate electrode, the sidewalls and the source region. The method further includes forming a gate contact and a source contact by subjecting the metal layer to a temperature of at least about 800° C. The gate contact and the source contact comprise a metal silicide. The distance between the gate contact and the source contact is less than about 0.6 μm. A vertical SiC MOSFET is also provided.

22 Claims, 9 Drawing Sheets

U.S. PATENT DOCUMENTS

| | | | |
|---|---|---|---|
| 6,291,861 | B1 | 9/2001 | Iwata et al. |
| 6,573,534 | B1 | 6/2003 | Kumar et al. |
| 6,599,644 | B1 | 7/2003 | Zekentes et al. |
| 6,797,602 | B1 | 9/2004 | Kluth et al. |
| 6,812,102 | B2 * | 11/2004 | Fukuda et al. ............... 438/298 |
| 6,972,460 | B2 * | 12/2005 | Aida et al. .................... 257/341 |
| 7,033,892 | B2 | 4/2006 | Hsu et al. |
| 7,288,828 | B2 | 10/2007 | Lin et al. |
| 7,362,609 | B2 | 4/2008 | Harrison et al. |
| 7,811,874 | B2 * | 10/2010 | Harada et al. ................. 438/198 |
| 7,829,416 | B2 * | 11/2010 | Kudou et al. .................. 438/268 |
| 2004/0214453 | A1 | 10/2004 | Endou et al. |
| 2005/0128787 | A1 | 6/2005 | Mouli |
| 2006/0006393 | A1 | 1/2006 | Ward, III et al. |
| 2006/0033165 | A1 | 2/2006 | Chan et al. |
| 2006/0051961 | A1 | 3/2006 | Cabral, Jr. et al. |
| 2006/0076579 | A1 | 4/2006 | Thean et al. |
| 2007/0004123 | A1 | 1/2007 | Bohr et al. |
| 2007/0181977 | A1 | 8/2007 | Lochtefeld et al. |
| 2007/0187756 | A1 | 8/2007 | Snyder |
| 2008/0108190 | A1 | 5/2008 | Matocha |

OTHER PUBLICATIONS

Lu et al., "Ohmic Contact Properties of Ni/C Film on 4H-SiC", Solid-State Electronics, vol. 47, pp. 2001-2010, 2003.

Han et al., "Ohmic Contact Formation Mechanism of Ni on n-type 4H-SiC", Applied Physics Letters, vol. 79, No. 12, pp. 1816-1818, Sep. 17, 2001.

Chow et al., "Refractory Metal Silicides: Thin-Film Properties and Processing Technology", IEEE Transactions on Electron Devices, vol. ED-30, No. 11, pp. 1480-1497, Nov. 1983.

Hofmann et al., "Preferential Sputtering of Argon Ion Bombarded Ni3Al and TaSi2", Applied Surface Science, vol. 90, pp. 227-233, 1995.

Curtis et al., "The Reactive Ion Etching of Tantalum Silicide/Polysilicon Bilayers in Silicon Tetrachloride and Hydrogen Chloride", J. Electrochem. Soc., vol. 136, No. 5, pp. 1463-1468, May 1989.

Murarka et al., "Silicide Formation in Thin Cosputtered (tantalum+silicon) Films on Polycrystalline Silicon and SiO2", J. Appl. Phys., vol. 51, No. 3, pp. 1593-1598, Mar. 1980.

Teal et al., "Stresses in TaSix Films Sputter Deposited on Polycrystalline Silicon", J. Appl. Phys., vol. 61, No. 11, pp. 5038-5046, Jun. 1, 1987.

Sinha et al., "MOS Compatibility of High-Conductivity TaSi2/n+ Poly-Si Gates", IEEE Transactions on Electron Devices, vol. ED-27, No. 8, p. 1425-1430, Aug. 1980.

Sun et al., "Reactive-Ion Etching (RIE) of TaSi2/n+ Polysilicon Bilayers", J. Electrochem. Soc.: Solid-State Science and Technology, pp. 2353-2357, Sep. 1988.

Murarka et al., "Oxidation of Tantalum Disilicide on Polycrystalline Silicon", J. APpl. Phys., vol. 51, No. 6, pp. 3241-3245, Jun. 1980.

Murarka et al., "Refractory Silicides of Titanium and Tantalum for Low-Resistivity Gates and Interconnects", IEEE Transactions on Electron Devices, vol. ED-27, No. 8, pp. 1409-1417, Aug. 1980.

* cited by examiner

SIC MOSFETS AND SELF-ALIGNED FABRICATION METHODS THEREOF

CROSS-REFERENCE TO RELATED APPLICATION

This application is a continuation-in-part of U.S. patent application Ser. No. 11/593,317, filed on Nov. 6, 2006, which is hereby incorporated herein in its entirety by reference.

BACKGROUND

The invention relates generally to methods of fabricating silicon carbide based metal oxide field effect transistors (MOSFETs) and in particular to self-aligned methods of fabricating silicon carbide based MOSFETs.

Silicon carbide (SiC) is an attractive alternative to silicon (Si) for high voltage, high power applications due to the inherent material properties of SiC. For example, SiC exhibits a wide band gap and a high thermal conductivity that facilitates elevated temperature operation.

For certain devices such as, SiC vertical metal oxide field effect transistors (MOSFET), close packing of adjacent cells is desirable, to enhance on-resistance and switching performance. To increase cell packing density, the spacing between the gate and source contacts must be reduced. However, a reduction in the gate to source contact spacing typically reduces the manufacturable yield of SiC MOSFETs.

Therefore, it is desirable to provide a method that addresses these issues related to the spacing between gate and source contacts in vertical SiC MOSFETs. It is also desirable to increase the manufacturable yield of closely packed vertical MOSFET devices. Accordingly, a technique is needed to address one or more of the foregoing problems in the fabrication of SiC MOSFET devices.

BRIEF DESCRIPTION

In one aspect, a method of fabricating a metal oxide semiconductor field effect transistor is provided. The method includes the steps of forming a source region on a SiC layer and annealing the source region. A gate oxide layer is formed on the source region and the SiC layer. The method further includes providing a gate electrode on the gate oxide layer and disposing a dielectric layer on the gate electrode and the gate oxide layer. The method further includes etching a portion of the dielectric layer and a portion of the gate oxide layer to form sidewalls on the gate electrode. A metal layer is disposed on the gate electrode, the sidewalls and the source region. The method further includes forming a gate contact and a source contact by subjecting the metal layer to a temperature of at least about 800° C. The gate contact and the source contact comprise a metal silicide. The distance between the gate contact and the source contact is less than about 0.6 μm.

In another aspect, a vertical SiC metal oxide semiconductor field effect transistor (MOSFET) is provided. The SiC MOSFET includes a SiC layer having a source region. A gate oxide layer is disposed on the SiC layer and extends over at least a portion of the source region. The MOSFET includes a gate electrode disposed on the gate oxide layer and a gate contact disposed on the gate electrode. The gate contact comprises metal silicide. The MOSFET further includes a source contact extending over at least a portion of the source region. The source contact comprises metal silicide, and the distance between the gate contact and the source contact is less than about 0.6 μm.

In yet another aspect, a method is provided that includes providing a silicon carbide layer, a gate oxide layer (e.g., silicon dioxide, silicon nitride, or glass forming material) on the silicon carbide layer, and a gate electrode including silicon on the gate oxide layer (e.g., a polycrystalline silicon or "polysilicon"-including gate electrode). A conductive layer can be disposed adjacent to the gate electrode, the conductive layer being configured to electrically contact a gate voltage source. The conductive layer may be disposed such that the conductive layer extends substantially along a long dimension of the gate electrode. The silicon carbide layer, the gate oxide layer, the gate electrode, and the conductive layer may be subjected together to a temperature in a range of about 800 degrees Celsius (° C.) to about 1100° C. The silicon carbide layer may be configured to act as a MOSFET. The MOSFET can be operated with the conductive layer disposed on the gate electrode.

The conductive layer can be a metal layer, such as, for example, tantalum, nickel, cobalt, titanium, molybdenum, tungsten, niobium, hafnium, zirconium, vanadium, chromium, and/or platinum, or can be a metal silicide layer, such as, for example, silicides of the above metals. In one embodiment, tantalum silicide can be sputtered from a tantalum silicide source using a power of about 0.5 kW to 2.5 kW, an argon working gas at a pressure of about 5 mTorr to 25 mTorr.

In still another aspect, a device is provided that includes a semiconductor layer including silicon carbide. A gate oxide layer can be disposed on the semiconductor layer. A gate electrode including silicon can be disposed on the gate oxide layer, the gate electrode having a long dimension. The gate electrode can be configured to electrically contact a gate voltage source such that currents through the gate electrode that are induced by the voltage source are directed substantially transverse to the long dimension of the gate electrode. In one embodiment, the device may further include a conductive layer on the gate electrode, the conductive layer being configured to electrically contact a gate voltage source so as to establish electrical contact between the gate voltage source and said gate electrode.

DRAWINGS

These and other features, aspects, and advantages of the present invention will become better understood when the following detailed description is read with reference to the accompanying drawings in which like characters represent like parts throughout the drawings, wherein.

Figure 13:
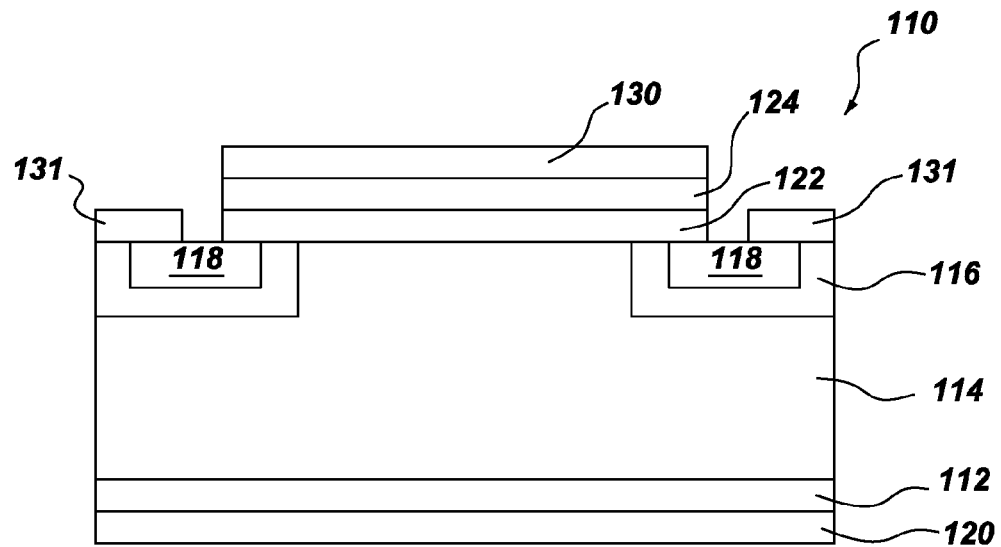
Figure 14:
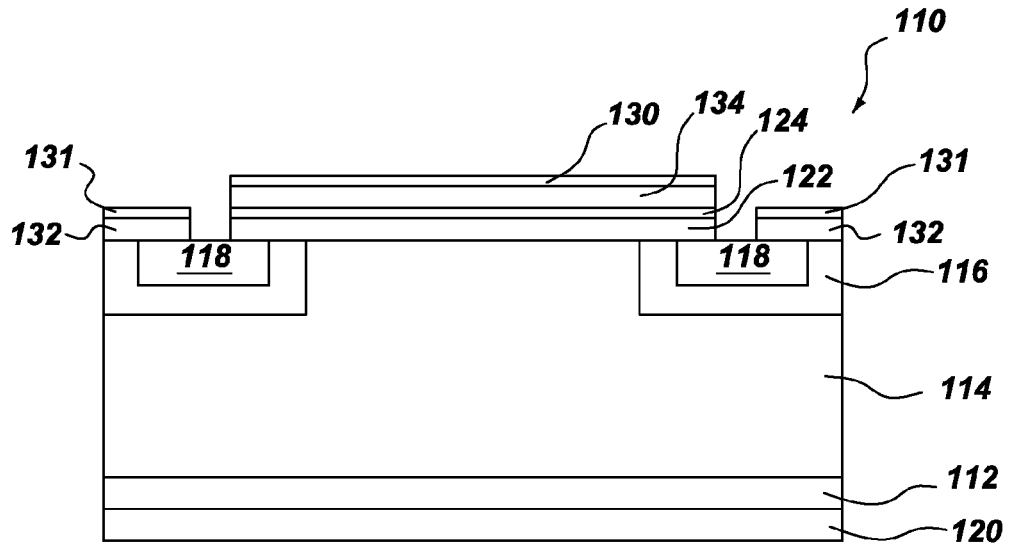
Figure 15:
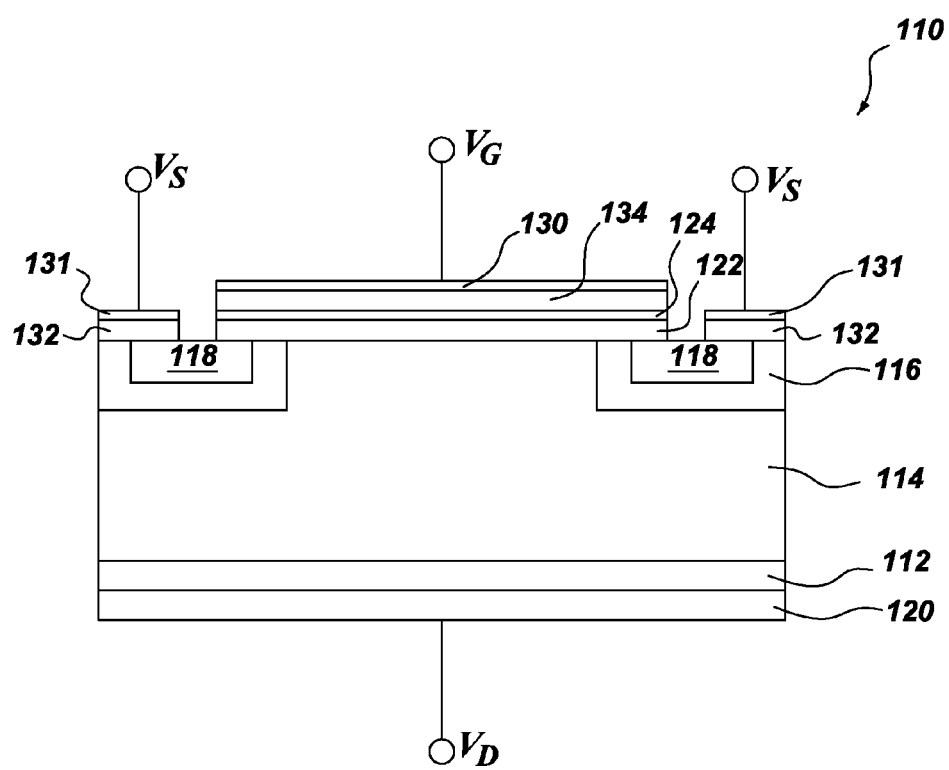
Figure 16:
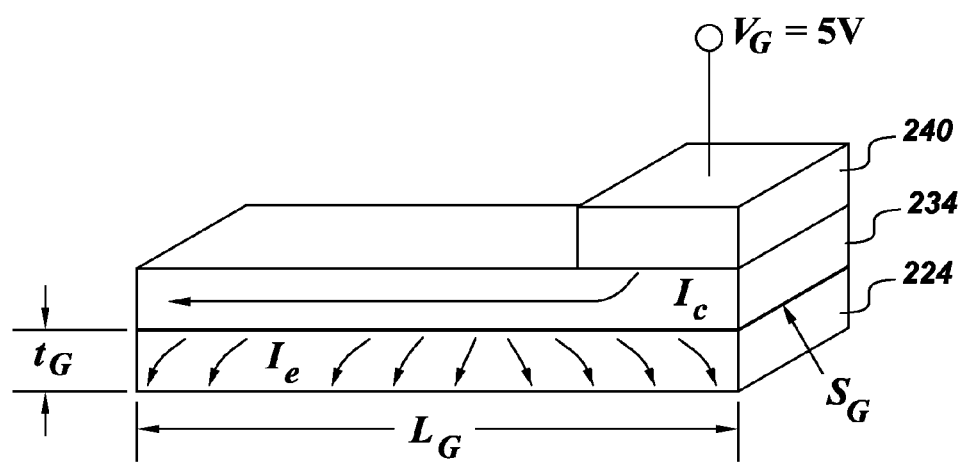
Figure 17:
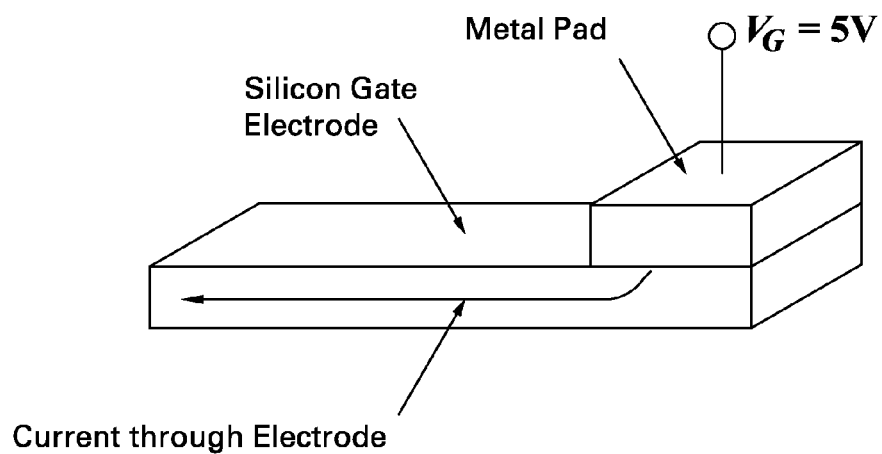

FIGS. 15 and 16 schematically depict the operation of the vertical SiC MOSFET fabricated as shown in FIGS. 7-14; and FIG. 17 schematically depicts the operation of a typical MOSFET.

DETAILED DESCRIPTION

It will be understood by those skilled in the art that "n-type" and "p-type" refer to the majority of charge carriers, which are present in a respective layer. For example, in n-type layers, the majority carriers are electrons, and in p-type layers, the majority carriers are holes (the absence of electrons). As used herein, n+ and n refer to higher (greater than $1 \times 10^{18}$ cm$^{-3}$) and lower (generally in the range of $5 \times 10^{15}$ cm$^{-3}$ to $5 \times 10^{17}$ cm$^{-3}$) doping concentrations of the dopants, respectively.

As used herein, the term "about" should be understood to indicate plus or minus fifty percent (+/−50%).

A MOSFET is a type of transistor that includes a gate, a drain and a source. The source and drain of a typical MOSFET are formed of a semiconducting substrate such as Si. For SiC MOSFETs, the semiconducting substrate comprises SiC. The gate is separated from the substrate by an insulating layer. As will be appreciated, upon application of a voltage or an electric field across the gate, the source to drain current can be controlled. The current generated is then transferred from the substrate through respective gate and source contacts.

The performance of a MOSFET is to a large extent dependent on the gate and source contacts. It is desirable that the gate and source contacts are electrically and structurally stable during operation and also that they offer minimal ohmic resistance to passage of current. Moreover, by reducing the distance or spacing between the source contact and the gate contact in a MOSFET, the size of the MOSFET may be reduced and more of such MOSFETs may be packed within, for example, an integrated chip. Advantageously, the increase in packing density may enhance the on-resistance and switching performance of the device. The methods for enhancing the packing density may suffer from one or more limitations. For example, the methods for reducing the distance between the source contact and the gate contact may inadvertently cause the shorting of these contacts due to poor alignment.

Example embodiments of the present invention are described below in detail with reference to the accompanying drawings, where the same reference numerals denote the same parts throughout the drawings. Some of these embodiments may address the above and other needs.

Figure 1:
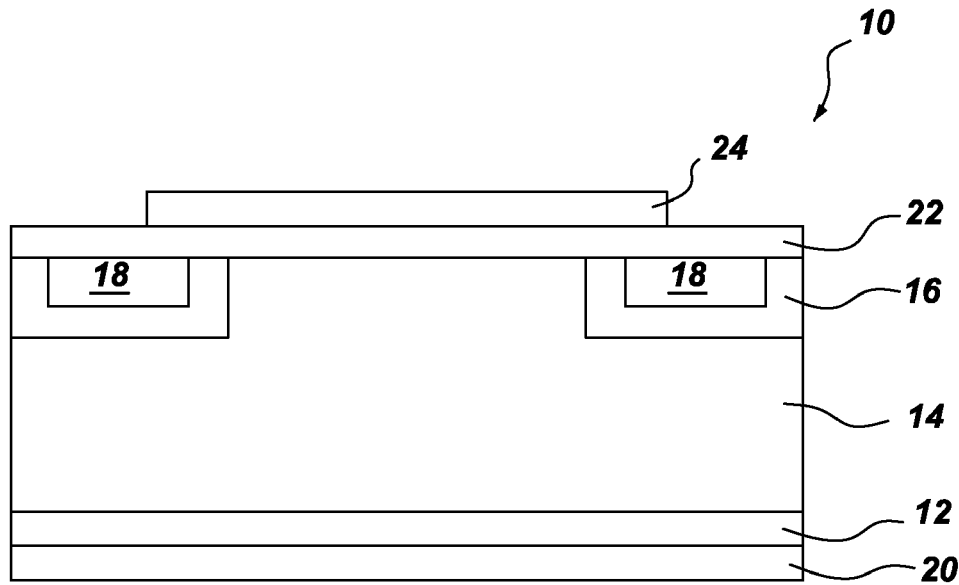
FIGS. 1-6 illustrate fabrication stages of a vertical SiC MOSFET, according to example embodiments.

Turning now to the figures, FIGS. 1-6 illustrate fabrication stages of a vertical SiC MOSFET 10, according to embodiments of the present invention. FIG. 1 is a cross-sectional side view of a vertical SiC MOSFET 10. The SiC MOSFET 10 includes a semiconductor layer 12 having a drift region 14 disposed thereon. The semiconductor layer 12 may be a semiconductor substrate on which other materials are formed, disposed and/or patterned. Alternatively, semiconductor layer 12 may be an intermediate layer of a device being fabricated on an underlying substrate. The semiconductor layer 12 may be a semiconductor material such as, Si, SiC, aluminum nitride, sapphire, or gallium nitride, for example. Further, the semiconductor layer 12 may be a polytype of SiC, such as 4H—SiC, or 6H—SiC polytypes. The semiconductor layer 12 may be p-type doped, or n-type doped or even undoped. In the illustrated embodiment, the semiconductor layer 12 is of 4H—SiC and is n-type doped. The semiconductor layer 12 may have a thickness of about 350-550 micrometers (μm) and a dopant concentration of about $5 \times 10^{18}$ ions/cm$^3$, for example. In certain embodiments, the thickness of the semiconductor layer 12 may be in a range of about 200 μm to about 600 μm. In some embodiments, the dopant concentration of the semiconductor layer 12 may be in a range of about $1 \times 10^{18}$ ions/cm$^3$ to about $1 \times 10^{21}$ ions/cm$^3$.

The drift region 14 is of SiC. Further, the drift region 14 may be a polytype of SiC, such as 4H—SiC, or 6H—SiC polytypes. In the illustrated example of the MOSFET 10 having an n+ doped source region, the drift region 14 is n-type doped with n-type dopants such as nitrogen, phosphorus, or any combinations thereof. As will be appreciated, for a MOSFET 10 having a p+ doped source region, the drift region 14 may be doped with p-type dopants including boron, aluminum, gallium, carbon, or any combinations thereof. The dopants may be introduced during the formation of the drift region 14, for example. In some embodiments, a deposition technique such as, chemical vapor deposition (CVD) may be performed to form the drift region 14. Alternatively, an epitaxial growth of the semiconductor layer 12 is performed to form the drift region 14, and the dopants are introduced during the epitaxial growth. The drift region 14 may have a doping concentration in a range of about $1 \times 10^{14}$ ions/cm$^3$ to about $1 \times 10^{16}$ ions/cm$^3$. In one embodiment, the drift region 14 is about 12 μm thick and is of 4H—SiC with an n-type doping level of about $9 \times 10^{15}$ ions/cm$^3$.

In the drift region 14, P-well regions 16 are formed. The P-well region 16, in one embodiment, is formed by ion implantation of p-type dopants such as boron, aluminum, gallium, carbon, or any combinations thereof in the drift region 14. As will be appreciated, the formation of p-well region 16 may involve a number of processing steps such as, masking the drift region 14 by a first mask, and patterning the first mask prior to ion implantation in the drift region 14. In one embodiment, the masking is by the application of a photoresist over the drift region 14. The applied photoresist is then patterned by forming openings, wherein the openings correspond to an area of the P-well region 16. Through the openings in the photoresist the p-type dopant ions are implanted in the drift region 14 to obtain the P-well regions 16. In one embodiment, subsequent to the formation of P-well region 16, the photoresist is removed. Alternatively, a second mask may be applied on the first mask prior to ion implantation to form a source region 18 in the P-well region 16. The implanted p-type dopants are then annealed at elevated temperatures to electrically activate the implanted ions. In one embodiment, the annealing temperature is greater than about 1100° C. In some embodiments, the annealing temperature is in a range of about 1100° C. to about 1900° C. Typically, the concentration of the implanted ions in the P-well region 16 is greater than that of the drift region 14 to facilitate implantation of p-type dopants in the n-doped drift region 14. In one embodiment, the concentration of the p-type dopants in the P-well region 16 is greater than about $1 \times 10^{16}$ ions/cm$^3$. In certain embodiments, the concentration of the p-type dopants in the P-well region 16 is in a range of about $1 \times 10^{16}$ ions/cm$^3$ to about $5 \times 10^{18}$ ions/cm$^3$.

The n+ source region 18 is formed in the P-well regions 16. In one embodiment, a second mask is applied after the removal of the first mask and may include processes as described with reference to the first masking process. The n-type dopants are implanted in the P-well region 16 through the openings in the second mask, for example, in a method involving the masking technique. Example n-type dopants include nitrogen, phosphorus, or any combinations thereof. The n+ source region 18 has a dopant concentration greater than about the concentration of the p-type dopants in the P-well region 16. In some embodiments, the dopant concentration in the n+ source region 18 is greater than about $1 \times 10^{18}$ ions/cm$^3$. In certain embodiments, the dopant concentration in the n+ source region 18 is in a range of about $1 \times 10^{18}$ ions/cm$^3$ to about $1 \times 10^{21}$ ions/cm$^3$. Subsequent to the formation of the source region 18, the implanted n-type dopants are annealed at elevated temperature so as to activate the implanted ions. In one embodiment, the annealing temperature is greater than about 1650° C. In some embodiments, the annealing temperature is in a range of about 1100° C. to about 1900° C.

A drain region 20 may be provided on a surface of the semiconductor layer 10 opposite to the drift region 14. In some embodiments, the drain region 20 forms part of the semiconductor layer 12 which is heavily n-type doped. The concentration of the dopants in the drain region 20, in some embodiments, is greater than about $1 \times 10^{18}$ ions/cm$^3$. In certain embodiments, the concentration of the dopants in the drain region 20 is in a range of about $1\times10^{18}$ ions/cm$^3$ to about $1\times10^{21}$ ions/cm$^3$.

A gate oxide layer 22 is disposed on the source region 18, the P-well regions 16 and on the drift region 14. The formation of the gate oxide layer 22, in one example, is through thermal oxidation of the drift region 14. In another example, a low temperature chemical vapor deposition (CVD) technique is used to form the gate oxide layer 22. The gate oxide layer comprises silicon dioxide (SiO$_2$), silicon nitride or other glass forming materials. Non-limiting examples of glass forming materials include borosilicate glass or phosphosilicate glass. Typical thickness of the gate oxide layer 22 is less than about 200 nanometers. In some embodiments, the thickness of the gate oxide layer 22 is in a range of about 20 nanometers to about 200 nanometers.

A gate electrode 24 is disposed on the gate oxide layer 22. Exemplary gate electrode 24 materials include metals and polysilicon. The deposition of the gate electrode 24, in one embodiment, is performed using physical vapor deposition (PVD) techniques such as sputtering or evaporation. Alternatively, a chemical vapor deposition technique may be utilized. The gate electrode 24 covers a portion of the gate oxide layer 22. The remaining uncovered portion of the gate oxide layer 22 corresponds to a future location of a source contact. Typically, the thickness of the gate electrode 24 is about 0.5 µm. In some embodiments, the thickness of the gate electrode 24 is in a range of about 0.1 µm to about 1.0 µm.

Figure 2:
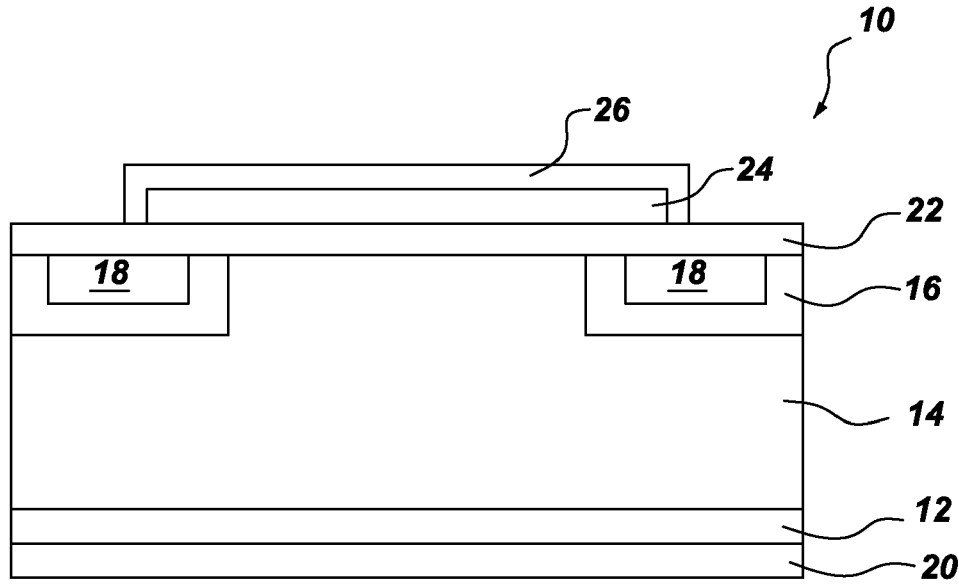

As shown in FIG. 2, a dielectric layer 26 is disposed on the gate electrode 24 and the gate oxide layer 22. The dielectric layer 26 forms a thin layer around the gate electrode 24 and may advantageously protect the gate electrode 24 from damages from subsequent processing steps. In exemplary embodiments, the dielectric layer 26 comprises silicon dioxide or silicon nitride. In one embodiment, the deposition of the dielectric layer 26 is through thermal oxidation of the gate electrode 24. Following thermal oxidation, the dielectric layer 26 is annealed at temperatures greater than about 1100 degrees Celsius. Alternatively, a chemical vapor deposition technique may be employed. The thickness of the dielectric layer 26 may play a part in determining the distance between a source contact and a gate contact. In some embodiments, the thickness of the dielectric layer 26 is greater than about 0.5 µm. In one embodiment, the thickness of the dielectric layer 26 is in a range of about 0.1 µm to about 1.0 µm.

Figure 3:
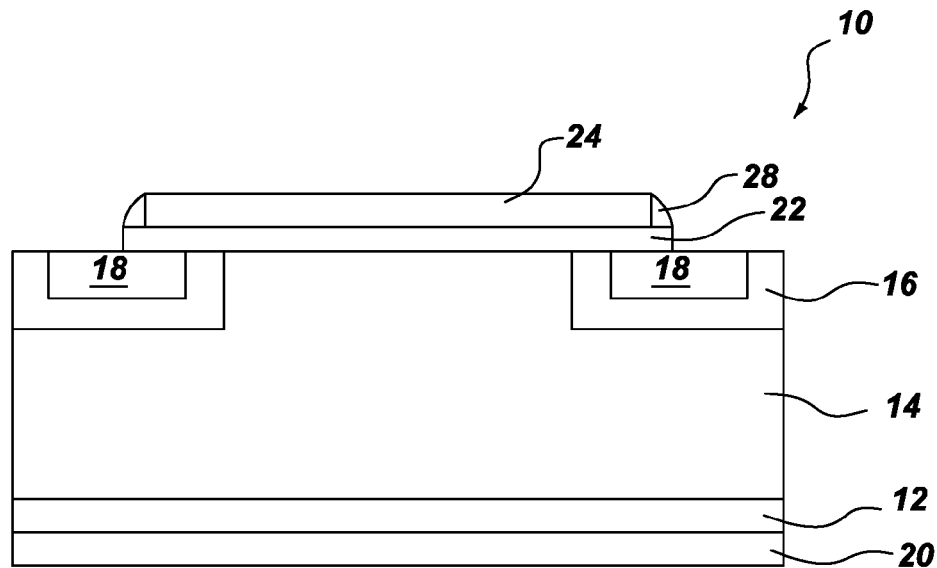

The dielectric layer 26 and the gate oxide layer 22 are then subjected to etching such that a portion of the gate oxide layer 22 and a portion of the dielectric layer 26 are removed so as to form sidewalls 28 on the gate electrode 24, as shown in FIG. 3. In one embodiment, the etching is performed using a dry etch process. In one embodiment, the dry etch is through a reactive ion etch (RIE) method. In the reactive ion etch method, etchants such as CF$_4$ and O$_2$ are used, which preferentially etches the gate oxide layer 24 and the dielectric layer 26 while the etchants CF$_4$ and O$_2$ have minimal action towards the drift region 14. The portion of the gate oxide layer 24 and the portion of the dielectric layer 26 are etched away to form the sidewalls 28. According to embodiments of the present invention, the width of the sidewalls 28 is advantageously used to control the distance between a gate contact and a source contact.

Figure 4:
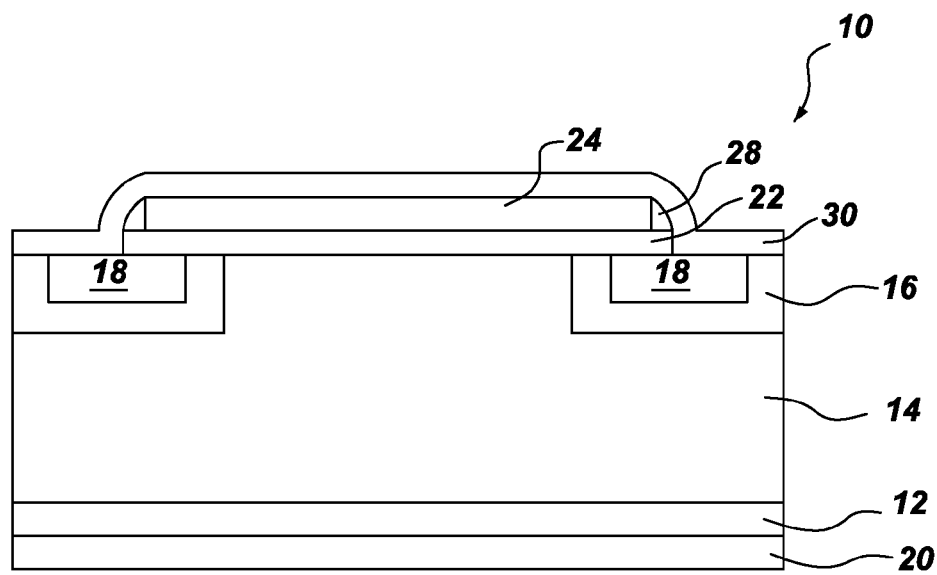

FIG. 4 depicts a metal layer 30 disposed on the gate electrode 24, the sidewalls 28 and over the P-well region 16 and the source region 18. In one embodiment, the deposition of metal layer 30 is through PVD techniques such as sputtering or evaporation. In another embodiment, the metal layer 30 is deposited using a chemical vapor deposition technique. In a particular embodiment, the metal layer comprises nickel. In other embodiments, the metal layer 30 comprises cobalt or titanium. The metal layer 30 is deposited as a thin layer. In some embodiments, the thickness of the metal layer 30 is in a range of about 25 nm to about 500 nm. In certain embodiments, the thickness of the metal layer 30 is in a range of about 25 nm to about 55 nm. In one particular embodiment, the thickness of the metal layer 30 is about 55 nm.

Figure 5:
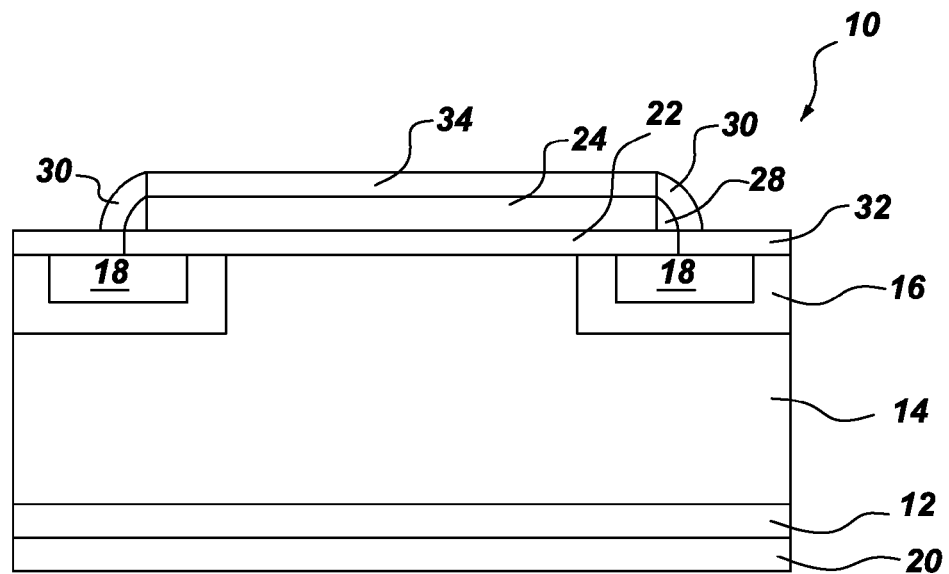

The metal layer 30 is then subjected to high temperature annealing to form metal silicide layers 32 and 34 (layers 32 and 34 are the future source and gate contacts, respectively), respectively, as shown in FIG. 5. The metal reacts with Si to form the respective metal silicide. For example, when the metal layer 30 comprises nickel, then the layers 32 and 34 comprise nickel silicide. In other embodiments, the metal silicide comprises cobalt silicide or titanium silicide. The metal layer 30 in contact with the underlying Si at the source region 18 reacts to form the metal silicide layer 32. Similarly, the metal layer 30 in contact with the underlying Si at the gate electrode 24 form the metal silicide layer 32. As will be appreciated, the sidewalls 28 comprising the dielectric material, for example, silicon dioxide shows no activity towards the metal and hence there is no metal silicide formation on the sidewalls 28. According to embodiments of the present invention, the distance between the metal silicide layers 32 and 34 is to a large extent dependent on the width of the sidewalls 28. In one embodiment, the distance between the metal silicide layers 32 and 34 is less than about 0.6 µm. In some embodiments, the distance between the metal silicide layers 32 and 34 is in a range of about 0.1 µm to about 1.0 µm.

In one embodiment, the metal layer 30 is annealed at a temperature of at least about 800° C. In some embodiments, the annealing temperature is in a range of about 800° C. to about 1100° C. In one example, the metal layer 30 is annealed at a temperature of about 1050° C. for 3 minutes in nitrogen. Exemplary anneal times are in a range of about 1 minute to about 30 minutes. The composition of the metal silicide layers 32 and 34, and in turn the quality of the resultant ohmic contacts to a certain extent depends on the annealing temperature. Typically, nickel silicide contacts are formed at temperatures lower than about 700° C. to avoid undesirable changes in the underlying layers. For example, high temperature annealing may result in diffusion of dopants from a source region to a substrate which may decrease the efficiency of the device.

According to embodiments of the invention, an annealing temperature of greater than about 800° C. may result in a better contact than the contact formed at temperatures below about 700° C. Although, the applicant does not wish to be bound by any particular theory, it is believed that the high temperature anneal may form a metal silicide phase that may lower the ohmic resistance at the interface between the SiC and the metal silicide and hence may result in a better contact.

The metal silicide layers 32 and 34 may have a thickness of at least about 55 nm, in one embodiment. In some embodiments, the thickness of the metal silicide layers 32 and 34 is in a range of about 25 nm to about 500 nm.

Figure 6:
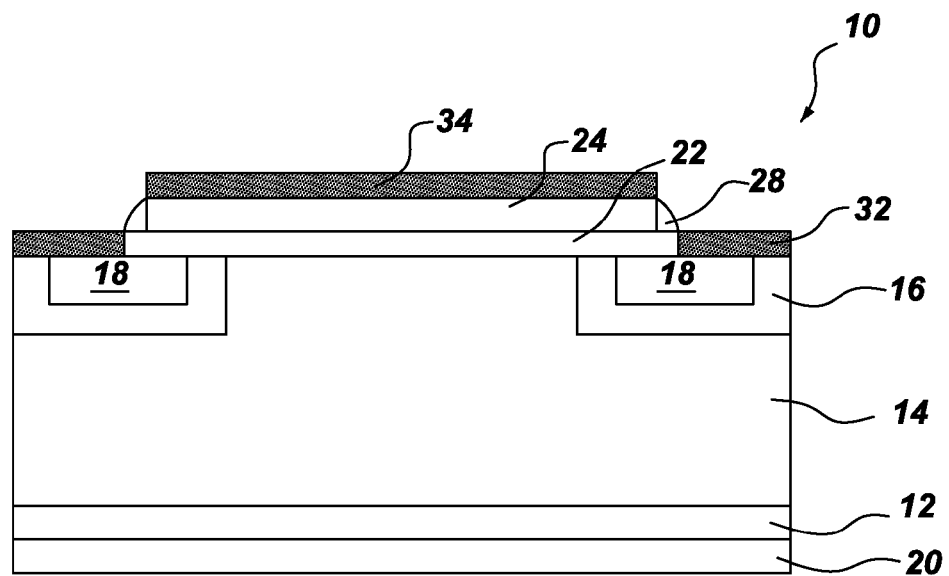

The remaining metal (that is on the sidewalls 28) is then etched to form the source contact 32 and the gate contact 34, respectively, as depicted in FIG. 6. The etching is through a wet-etching process that preferentially etches the metal while leaving the source contact 32 and the gate contact 34 behind.

The source contact 32 and the gate contact 34 are typically used to provide low resistance contacts for the source region 18 and the gate electrode 24. In one embodiment, at least one of the source contact 32 and the gate contact 34 has a contact resistivity of less than about $10^{-5}$ ohm/cm$^{-2}$. In some embodiments, at least one of the source contact 32 and the gate contact 34 has a contact resistivity in a range of about $10^{-3}$ ohm/cm$^{-2}$ to about $10^{-6}$ ohm/cm$^{-2}$.

The SiC vertical MOSFET 10 formed using above-described embodiments advantageously has a spacing of less than about 0.6 µm between the source contact and the gate contact. In some embodiments, the spacing between the source contact and the gate contact is in a range of about 0.1 µm to about 1.0 µm. Moreover, using self-aligned methods may provide a better alignment of the source contact and the gate contact with respect to the each other, and with the respect to the source region and the gate region, thus avoiding undesirable shorting effects that reduces the manufacturable yield of the MOSFETs.

Referring to FIGS. 7-14, therein is schematically shown fabrication stages of a vertical SiC MOSFET 110 configured in accordance with another example embodiment. The SiC MOSFET 110 includes a semiconductor layer 112 having a drift region 114 disposed thereon (see FIG. 7). In the illustrated embodiment, the semiconductor layer 112 is of 4H—SiC and is n-type doped. The semiconductor layer 112 may have a thickness of about 350-550 µm and a dopant concentration of about $5 \times 10^{18}$ ions/cm$^3$, for example.

The drift region 114 is of SiC. In the illustrated example where the MOSFET 110 has an n+ doped source region, the drift region 114 is n-type doped. As discussed above, the dopants may be introduced during the formation of the drift region 114, for example, by CVD or epitaxial growth onto the semiconductor layer 112. The drift region 14 may have a doping concentration in a range of about $1 \times 10^{14}$ ions/cm$^3$ to about $1 \times 10^{16}$ ions/cm$^3$. In one embodiment, the drift region 114 is about 12 µm thick and is of 4H—SiC with an n-type doping level of about $9 \times 10^{15}$ ions/cm$^3$.

Figure 7:
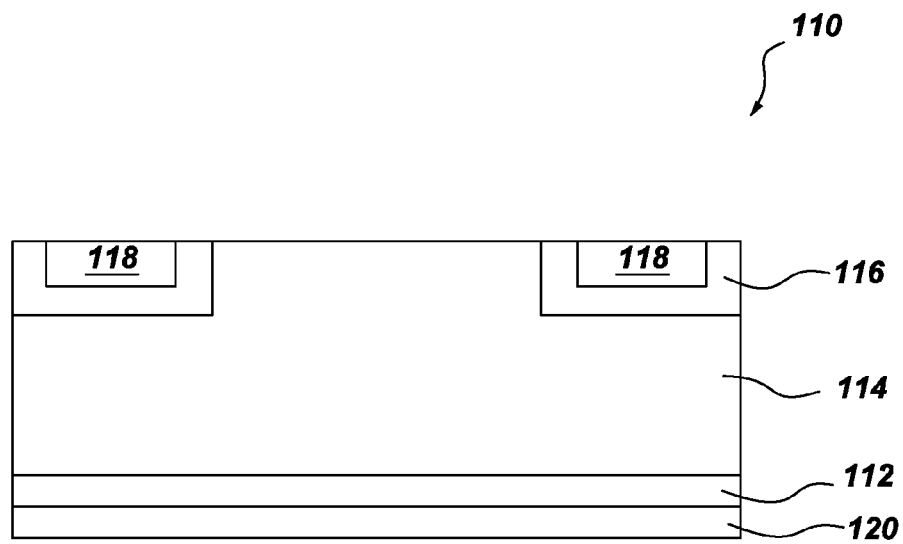
FIGS. 7-14 illustrate fabrication stages of a vertical SiC MOSFET, according to another example embodiment.

In the drift region 114, P-well regions 116 are formed (FIG. 7). The P-well regions 116 may be formed, for example, by ion implantation into the drift region 114 and subsequent annealing, as discussed above. The n+ source region 118 can then be formed in the P-well regions 116, for example, using ion implantation followed by annealing, and similarly a drain region 120 may be provided on a surface opposite to the drift region 114 (FIG. 7).

Figure 8:
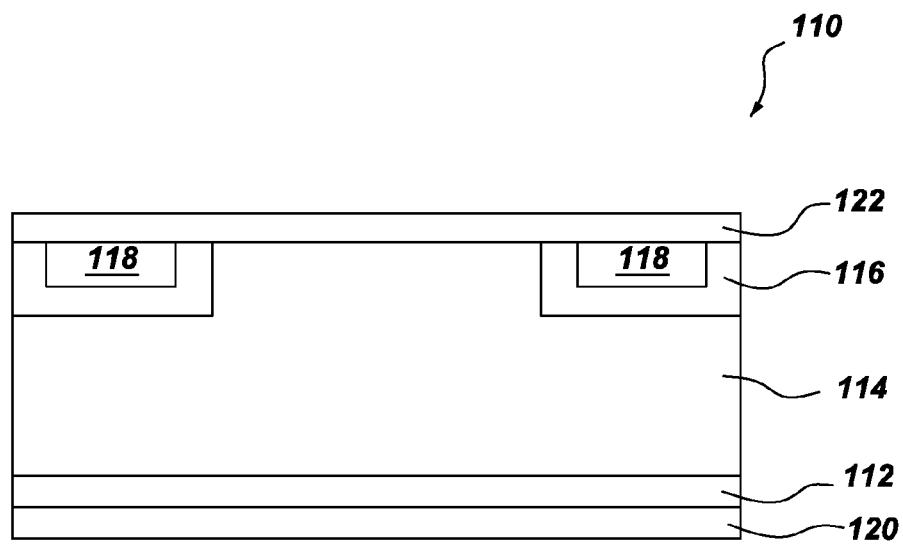
Figure 9:
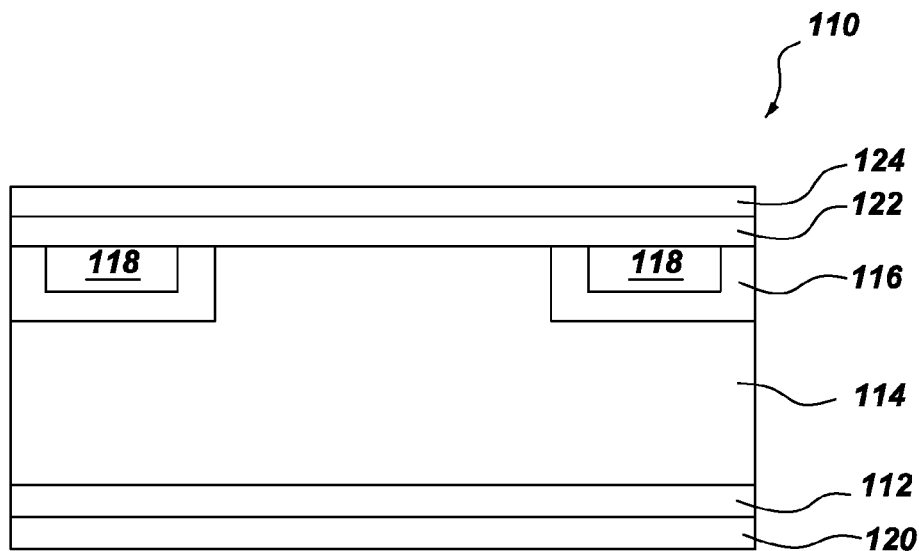

A 20-200 nm gate oxide layer 122 can be disposed on the source region 118, the P-well regions 116 and on the drift region 114 (FIG. 8). The formation of the gate oxide layer 122 can be, for example, through thermal oxidation of the drift region 114 or low temperature CVD. The gate oxide layer can include SiO$_2$, silicon nitride, or other glass forming materials (e.g., borosilicate glass, phosphosilicate glass). A polysilicon gate electrode layer 124 can then be disposed, via PVD or CVD on the gate oxide layer 122 (FIG. 9). The thickness of the gate electrode layer 124 can be, for example, in a range of about 0.1 µm to about 1.0 µm. The polysilicon gate electrode layer 124 may then be doped, for example, using ion implantation or high temperature diffusion from a gas source, in order to increase the conductivity thereof.

Figure 10:
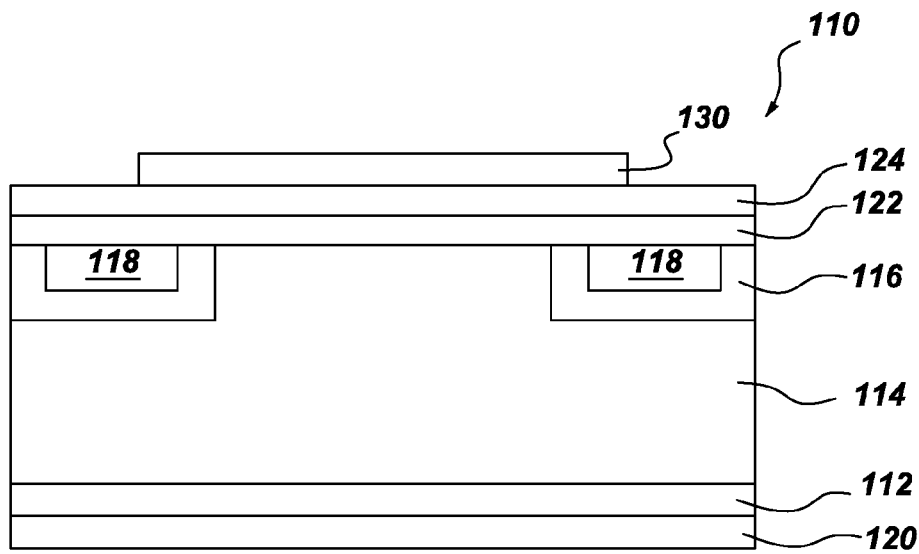

A patterned metal layer 130 can then be disposed adjacent to, in the illustrated case on, the gate electrode 124 (FIG. 10). The deposition of metal layer 130 (typically an initially blanket metal layer) can be through, for example, PVD, CVD, and or plating of a blanket film followed by patterning (discussed below). The metal layer 130 may include, for example, tantalum, nickel, molybdenum, cobalt, titanium, and/or other transition metal elements, and can have a thickness, for example, ranging from about 25 nm to about 500 nm. In one embodiment, the metal layer 130 may be formed of tantalum deposited via sputtering.

Figure 11:
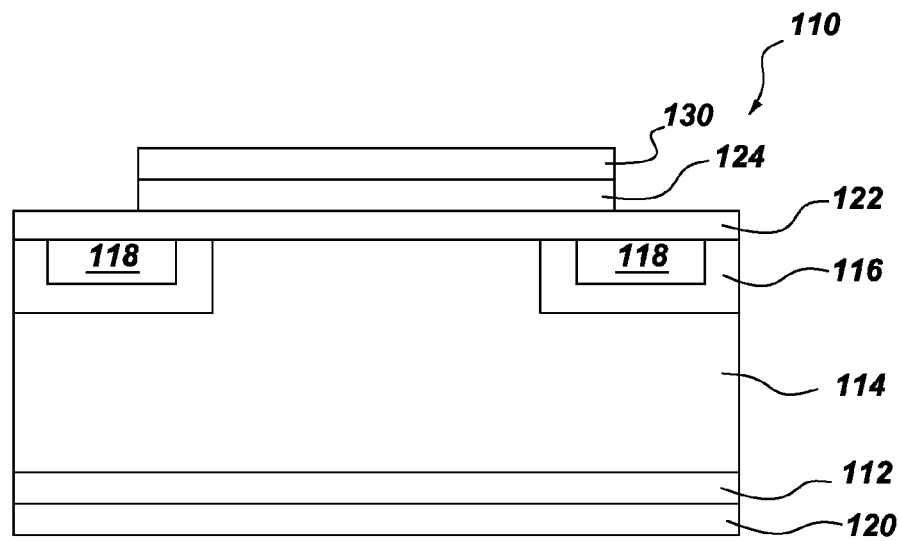
Figure 12:
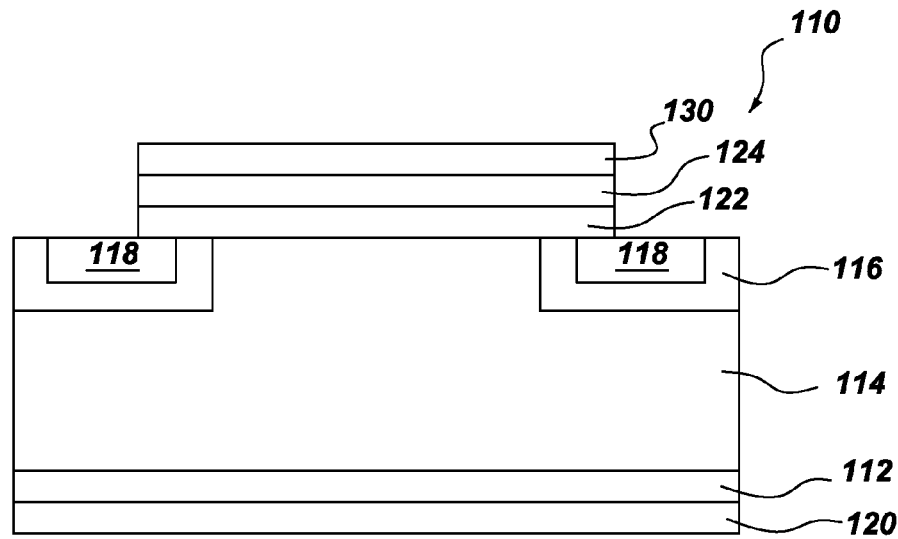

Deposition of the (typically blanket) metal layer 130 can be followed by patterning of the metal using standard positive or negative photolithographic techniques. The metal layer 130 can be patterned such that the metal layer can, ultimately, electrically communicate with a gate voltage source V$_G$ (see FIG. 15). In some embodiments, the metal layer 130 may be annealed prior to patterning, for example, at a temperature ranging from 300° C. to 700° C., although in other embodiments such an anneal is eliminated. Thereafter, the patterned metal layer 130 can be used as a mask layer in order to etch the underlying polysilicon gate electrode layer 124 and the oxide layer 122 (FIGS. 11 and 12). Alternatively, the same masking layers that allow patterning of the metal layer 130 (e.g., a photoresist layer (not shown) over the metal layer) can be retained for patterning the polysilicon layer 124 and, in some cases, the oxide layer 122.

Metal 131 can then be disposed over the p-well regions 116 and the source regions 118 (FIG. 13). For example, the metal 131 (which can be the same as or different from the metal used for layer 130) could be deposited as a blanket layer and then patterned via photolithography. The MOSFET 110 may then be subjected to high temperature annealing at a temperature ranging from 300° C. to 1100° C. (e.g., about 1050° C. for 3 minutes in nitrogen). This annealing causes the formation metal silicide layers 132 and 134, as shown in FIG. 14, as the metal 130, 131 reacts with the respectively underlying Si and SiC and both the metal layers 130, 131 and the Si/SiC are at least partially consumed. For example, the metal 130 may include tantalum, in which case the layer 134 may include tantalum silicide. The relative concentration of Si may vary spatially within the metal silicide layers 132, 134, such that Si content may be higher in areas close to the initial metal-Si or metal-SiC interface and may decrease when moving away from the initial metal-Si or metal-SiC interface and toward the metal 130, 131. "Metal silicide" is therefore understood to refer to a range of metal-Si alloys rather than a specific alloy designation. Further, while distinct boundaries are shown between the metal silicide layers 132, 134 and the metal layers 130, 131, these boundaries may be diffuse In some embodiments, metal silicide layers may be produced by depositing (and patterning, possibly after heat treating at a temperature ranging from 300° C. to 700° C.) the metal silicide material (about 10-1000 nm in thickness) directly onto the underlying polysilicon gate and/or SiC substrate, rather than by inducing a reaction between a metal layer and underlying Si/SiC. The metal silicide material can be, for example, sputter deposited either from a metal silicide source or from metal and Si sources in parallel. For example, tantalum silicide can be produced by sputter deposition from either a TaSi$_2$ target or from separately powered Si and Ta sputter targets. The process parameters for depositing the tantalum silicide can include. The sputtering can be carried out, for example, a single pass with a 6 cm/min scan rate, at a power of about 2 kW and using argon (Ar) as the working gas at a pressure of 20 mTorr. Films deposited using these process parameters may be suitable for subsequent reactive ion etching (i.e., may show regular sidewalls following such etching). Other possible metal silicides that may be sputtered or otherwise deposited include, for example, silicides of nickel, cobalt, titanium, and/or platinum. In still other embodiments, a mixture of metal and Si may be co-deposited onto the Si gate and/or SiC substrate, after which a heat treatment can be performed to induce the diffusion of further Si into the metal or metal silicide layer from the underlying gate or substrate.

Eventually, electrical communication can be established between a gate voltage source V$_G$ and the metal layer 130, between a source voltage source V$_S$ and the metal layer 131, and between a drain voltage source $V_D$ and the drain region 120 (FIG. 15). Thereafter, MOSFET 110 would be operational.

For embodiments in which the metal silicide layer 134 includes tantalum silicide deposited via sputtering according to the above process parameters, Applicants have observed that the resulting metal silicide layer may exhibit a reduced residual stress. The reduced residual stress tends to enhance the mechanical stability of devices incorporating the reduced-stress metal layer. For example, mechanical failure of the interface between the metal layer and the underlying polysilicon gate is inhibited. Such residual stresses may be further reduced in the case where tantalum silicide is deposited stoichiometrically, in which case volume changes during subsequent annealing may be reduced, thereby potentially enhancing thermal stability at temperatures above 700° C. This aspect may be advantageous in cases where high temperature processing and/or operation of devices is desired or required, as may often be the case for SiC-based semiconductor devices. High-temperature processing is necessary in SiC devices for formation of ohmic contacts to the SiC and for re-flow treatments of inter-layer dielectric (ILD) films, both of which typically require heat treatments at temperatures ranging from about 800° C. to about 1100° C. Therefore, SiC devices require materials, such as silicides (for example, tantalum silicide, as observed by the Applicants) that are stable at high temperatures. This is in contrast to standard Si-based semiconductor devices, for which processing and operation temperatures are often limited to less than 450° C. in order to avoid detrimentally affecting the device junction depth.

MOSFET embodiments that include metal, metal silicide, or other low resistance materials over the gate may exhibit a lower effective electrical resistance of the gate structure of the device (hereinafter referred to as the "gate resistance" and/or $R_{gate}$). Referring to FIG. 16, one reason for this lowering of the effective gate resistance is that charge that is applied to the gate electrode 224 by the gate voltage source $V_G$ (and through, in this case, the metal pad 240) tends to be applied, via the intermediate conductive layer 234 (e.g., a layer of metal silicide), more completely across the surface $s_G$ of the gate. This effect may be enhanced by disposing the conductive layer 234 substantially along the long dimension $L_G$ of the gate electrode 224. As a result, transient currents $I_e$ through the gate electrode 224 are directed substantially along a direction transverse to the long dimension $L_G$ (e.g., in the illustrated case, along the thickness $t_G$ of the gate electrode), and have only a small directional component along the long dimension $L_G$ of the gate electrode. The current can spread along the long dimension $L_G$ via a current $I_C$ through the conductive layer 234. This is in contrast to the typical case, depicted in FIG. 17, in which charge is supplied to the gate electrode from the gate voltage source via a more localized point of electrical contact, from which point the charge must spread laterally through the gate electrode. This laterally-directed current may result in a longer current path through the gate electrode itself, and where the gate electrode is a somewhat resistive material, such as Si, a higher effective resistance. As such, it may be advantageous in some embodiments to have the intermediate conductive layer 234 extend along the long dimension $L_G$ to an extent sufficient to have more than a trivial impact on the current profile through the gate electrode 224.

In some embodiments, the MOSFET gate can be thought of as a distributed resistance-capacitance network. Configuring the gate as a long stripe that is contacted at one end by a gate voltage source may facilitate MOSFET formation, but can also lead to an elongated gate structure with a correspondingly increased gate resistance. Further, the gate typically rests atop a thin gate dielectric layer, so that there is significant capacitance between the gate and the underlying semiconductor substrate. When the gate voltage source applies a voltage $V_G$ at one end of the gate, that same voltage does not appear at the other end of the gate until some time later. The time required for the entire gate to reach the voltage $V_G$ becomes shorter as the resistance of the gate is reduced, and therefore, the turn on and turn off times of the MOSFET will be limited by the resistance of the gate electrode. After the gate resistance is reduced below a certain low value, for example by placing a layer of low resistance tantalum silicide in intimate contact with the higher resistance polysilicon gate as described above, the MOSFET turn on time will become mainly limited by the rise time of the voltage applied to the device, and is relatively independent of the gate resistance. Therefore, reducing the gate resistance can be important in producing a fast switching MOSFET.

In some embodiments, the lowering of the effective gate resistance may reduce switching losses associated with MOSFET operation. Specifically, for example, during the operation of a half-bridge power circuit, the associated switches can undergo fast transients of the drain voltage during the switching of devices from on to off. During this switching transient, the drain voltage rises quickly, which causes displacement current $I_{gate}$ to flow through the gate-drain capacitance and the gate resistance and to the gate drive. This displacement gate current can cause a voltage drop between the gate terminal and output of the gate drive, the magnitude of this voltage drop being equal to the product $I_{gate}*R_{gate}$. When this displacement gate current-induced voltage drop exceeds the MOSFET threshold voltage, the affected switch will inadvertently turn on. Such transient MOSFET activation events can result in increased switching losses and electromagnetic interference of the circuit (EMI).

The above described problem, while potentially of limited importance for Si-based devices, is exacerbated for SiC-based devices. More specifically, power semiconductor device efficiency relates to both the power dissipated by the device when conducting current (conduction losses) and the power dissipated while switching states, e.g., from conducting to non-conducting (switching losses). Ideal switches would minimize both power loss mechanisms to maximize the transfer of energy, through the device, between source and load. For power applications where high voltage and high frequency switching are required, it has been found that unipolar devices provide the preferred solution (e.g., Schottky diodes and MOSFETs). The alternative, bipolar devices, (e.g., PIN diodes, insulated gate bipolar transistors, and thyristors) have switching speeds that are limited by carrier recombination processes and are inherently slower, increasing the switching losses. In Si technology, efficient unipolar devices are found with ratings up to about 600 volts, above which voltage the Si thickness and doping levels required makes them prohibitively resistive (leading to unacceptably high conduction losses). This same cross over voltage does not occur in SiC until about 3000 volts due to the thinner material layers and higher doping possible for a given voltage rating. Thus efficient unipolar devices are possible for the >600 volts to 3000 volt range using SiC-based devices. However, Applicants have observed that operation in this regime introduces a greater sensitivity to gate resistance than usually seen for Si-based devices.

While the above-described issue may be of limited importance for Si-based devices, the problem can be exacerbated for SiC MOSFETs (relative to Si-based devices), for several reasons. First, the SiC MOSFET gate-drain capacitance density tends to be larger (due to typically higher doping levels and MOSFET channel packing density). Second, in SiC technology it is often advantageous to dope the polysilicon gate as p-type, but the resistance of p-type polysilicon is about four times higher than that for n-type polysilicon.

While only certain features of the invention have been illustrated and described herein, many modifications and changes will occur to those skilled in the art. For example, while some of the above described MOSFET embodiments have focused on a gate electrode having a conductive layer disposed along a top surface of the gate, in other embodiments the conductive layer may extend along a side surface of the gate. It is, therefore, to be understood that the appended claims are intended to cover all such modifications and changes as fall within the true spirit of the invention.

What is claimed:

1. A method comprising:
providing a silicon carbide layer;
providing a gate oxide layer on the silicon carbide layer;
providing a gate electrode including silicon on the gate oxide layer;
providing a dielectric layer on the gate electrode and the gate oxide layer;
removing a portion of the gate oxide layer and a portion of the dielectric layer to form a plurality of sidewalls on the gate electrode;
disposing a conductive layer adjacent to the gate electrode and the sidewalls, the conductive layer being configured to electrically contact a gate voltage source; and
subjecting together the silicon carbide layer, the gate oxide layer, the gate electrode, the conductive layer and the sidewalls to a temperature in a range of about 800° C. to about 1100° C.

2. The method of claim 1, wherein said disposing a conductive layer adjacent to the gate electrode includes disposing a conductive layer on the gate electrode such that the conductive layer extends substantially along a long dimension of the gate electrode.

3. The method of claim 1, wherein said providing a gate oxide layer on the silicon carbide layer includes providing a gate oxide layer that includes at least one of silicon dioxide, silicon nitride, or glass forming material.

4. The method of claim 1, wherein said providing a gate electrode including silicon on the gate oxide layer includes providing a gate electrode including polysilicon.

5. The method of claim 1, wherein said providing a silicon carbide layer includes providing a silicon carbide layer configured to act as a metal oxide semiconductor field effect transistor, said method further comprising operating the metal oxide semiconductor field effect transistor with the conductive layer disposed on the gate electrode.

6. The method of claim 1, wherein said disposing a conductive layer adjacent to the gate electrode includes disposing a metal silicide layer on the gate electrode and the sidewalls.

7. The method of claim 6, wherein said disposing a metal silicide layer on the gate electrode includes disposing a metal silicide layer selected from the group consisting of tantalum silicide, nickel silicide, cobalt silicide, titanium silicide, molybdenum silicide, tungsten silicide, niobium silicide, hafnium silicide, zirconium silicide, vanadium silicide, chromium silicide, and platinum silicide.

8. The method of claim 6, wherein said disposing a metal silicide layer on the gate electrode includes sputtering tantalum silicide from a tantalum silicide source using a power of about 0.5 kW to 2.5 kW and an argon working gas at a pressure of about 5 mTorr to 25 mTorr.

9. The method of claim 1, wherein said disposing a conductive layer adjacent to the gate electrode includes disposing a metal layer on the gate electrode and the sidewalls.

10. The method of claim 9, wherein said disposing a metal layer on the gate electrode includes disposing a layer including at least one of tantalum, nickel, cobalt, titanium, molybdenum, tungsten, niobium, hafnium, zirconium, vanadium, chromium, or platinum on the gate electrode and the sidewalls.

11. The method of claim 1, wherein said removing comprises etching the portion of the gate oxide layer and the portion of the conductive layer.

12. The method of claim 1 further comprising removing a portion of the conductive layer extending over each of the sidewalls.

13. The method of claim 12, wherein said removing comprises etching the respective portions of the conductive layer extending over each of the sidewalls.

14. The method of claim 12, wherein said removing forms a source contact and a drain contact.

15. A method comprising:
providing a semiconductor layer;
providing a gate oxide layer on the semiconductor layer;
providing a silicon gate electrode on the gate oxide layer;
providing a dielectric layer o the gate electrode and the gate oxide layer;
removing a portion of the gate oxide layer and a portion of the dielectric layer to form a plurality of sidewalls on the gate electrode;
disposing a conductive layer including tantalum silicide adjacent to the gate electrode and the sidewalls; and
subjecting the semiconductor layer, the gate oxide layer, the gate electrode, the conductive layer and the sidewalls to a temperature in a range of about 800° C. to about 1100° C.

16. The method of claim 15, wherein said disposing includes sputtering tantalum silicide from a tantalum silicide source using a power of about 0.5 kW to 2.5 kW, an argon working gas as a pressure of about 5 mTorr to 25 mTorr, the conductive layer being configured to electrically contact a gate voltage source.

17. The method of claim 15, wherein said disposing a conductive layer on the gate electrode and the sidewalls includes disposing a conductive layer on the gate electrode and the sidewalls such that the conductive layer extends substantially along a long dimension of the gate electrode.

18. The method of claim 15, wherein said providing a gate oxide layer on the silicon carbide semiconductor layer includes providing a gate oxide layer that includes at least one of silicon dioxide, silicon nitride, or glass forming material.

19. The method of claim 15, wherein said providing a gate electrode including silicon on the gate oxide layer includes providing a gate electrode including polysilicon.

20. The method of claim 15, wherein said providing a semiconductor layer includes providing a silicon carbide layer configured to act as a metal oxide semiconductor field effect transistor, said method further comprising operating the metal oxide semiconductor field effect transistor with the conductive layer disposed on the gate electrode.

21. A method comprising:
providing a silicon carbide layer;
providing a gate oxide layer on the silicon carbide layer;
providing a gate electrode on the gate oxide layer;
providing a dielectric layer on the gate electrode and the gate oxide layer;

removing a portion of the gate oxide layer and a portion of the dielectric layer to form a plurality of sidewalls on the gate electrode;

disposing a conductive layer adjacent to the gate electrode and the sidewalls, the conductive layer being configured to extend substantially along a long dimension of the gate electrode; and subjecting the silicon carbide layer, the gate oxide layer, the gate electrode, the conductive layer and the sidewalls to a temperature in a range of about 800° C. to about 1100° C.

22. The method of claim 21, wherein said conductive layer comprises tantalum silicide.

* * * * *